United States Patent
Uglietti et al.

(10) Patent No.: US 9,543,754 B2
(45) Date of Patent: Jan. 10, 2017

(54) SUPERCONDUCTING COIL PROTECTION METHOD AND SUPERCONDUCTING MAGNET DEVICE

(71) Applicants: National Institute for Materials Science, Tsukuba-shi (JP); Japan Superconductor Technology, Inc., Kobe-shi (JP)

(72) Inventors: Davide Uglietti, Tsukuba (JP); Tsukasa Kiyoshi, Tsukuba (JP); Shinji Matsumoto, Tsukuba (JP); Mamoru Hamada, Kobe (JP)

(73) Assignees: National Institute for Materials Science, Tsukuba-shi (JP); Japan Superconductor Technology, Inc., Kobe-shi (JP)

( * ) Notice: Subject to any disclaimer, the term of this patent is extended or adjusted under 35 U.S.C. 154(b) by 577 days.

(21) Appl. No.: 14/201,561

(22) Filed: Mar. 7, 2014

(65) Prior Publication Data
US 2014/0235451 A1     Aug. 21, 2014

Related U.S. Application Data

(63) Continuation of application No. PCT/JP2012/072359, filed on Sep. 3, 2012.

(30) Foreign Application Priority Data

Sep. 8, 2011    (JP) ................................. 2011-195756

(51) Int. Cl.
*H01B 12/00*     (2006.01)
*H02H 7/00*     (2006.01)
(Continued)

(52) U.S. Cl.
CPC ................ *H02H 7/001* (2013.01); *H01F 6/02* (2013.01); *G01R 33/3815* (2013.01);
(Continued)

(58) Field of Classification Search
USPC ............................................ 361/19; 505/211
See application file for complete search history.

(56) References Cited

U.S. PATENT DOCUMENTS

| | | | |
|---|---|---|---|
| 4,349,853 A * | 9/1982 | Sato .......................... | H01F 6/02 361/19 |
| 5,929,385 A | 7/1999 | Sugimoto et al. | |

(Continued)

FOREIGN PATENT DOCUMENTS

| | | |
|---|---|---|
| EP | 0 423 927 | 4/1991 |
| JP | 54-74391 | 6/1979 |

(Continued)

OTHER PUBLICATIONS

International Preliminary Report on Patentability issued Mar. 20, 2014 in PCT/JP2012/072359 filed Sep. 3, 2012.

(Continued)

*Primary Examiner* — Danny Nguyen
(74) *Attorney, Agent, or Firm* — Oblon, McClelland, Maier & Neustadt, L.L.P.

(57) ABSTRACT

An object of the present invention is to provide a method for protecting a superconducting coil, which method prevents damage to the superconducting coil caused by a quench or the like, in a new way, without using a voltage (a change in voltage) generated in the superconducting coil. Provided is the method for protecting a superconducting coil made by winding tape-like superconducting wire having a superconducting layer. Power from a power supply is shut off based on the magnitude of a screening field, which is a difference between a measured magnetic field B in a direction of a (Continued)

thickness of the superconducting wire at a predetermined position, and a magnetic field Bcal in the direction of the thickness of the superconducting wire calculated disregarding an effect of screening current.

6 Claims, 9 Drawing Sheets

(51) Int. Cl.
    *H01F 6/02*     (2006.01)
    *H02H 9/02*     (2006.01)
    *G01R 33/3815*     (2006.01)

(52) U.S. Cl.
    CPC .............. *H02H 9/023* (2013.01); *Y02E 40/68* (2013.01); *Y10S 505/85* (2013.01); *Y10S 505/872* (2013.01)

(56) References Cited

U.S. PATENT DOCUMENTS

| | | | |
|---|---|---|---|
| 2007/0053116 A1* | 3/2007 | Ichikawa | H02H 7/001 361/19 |
| 2009/0046399 A1 | 2/2009 | Kurusu et al. | |
| 2009/0122508 A1* | 5/2009 | Uchaykin | H05K 9/0077 361/818 |

FOREIGN PATENT DOCUMENTS

| | | |
|---|---|---|
| JP | 57-141904 | 9/1982 |
| JP | 03-105275 | 5/1991 |
| JP | 2001-274014 | 10/2001 |
| JP | 2006-319139 | 11/2006 |
| JP | 2007-215635 | 8/2007 |
| JP | 2009-246162 | 10/2009 |
| WO | WO 95/04449 A1 | 2/1995 |
| WO | WO2006/115126 | 11/2006 |

OTHER PUBLICATIONS

Written Opinion issued Nov. 27, 2012 in PCT/JP2012/072359 filed Sep. 3, 2012 (with English translation).
Y. Yanagisawa, et al., "Effect of Current Sweep Reversal on the Magnetic Field Stability for a Bi-2223 Superconducting Solenoid" Elsevier—Physica C, vol. 469, No. 22, 2009, pp. 1996-1999.
International Search Report issued Nov. 27, 2012 in PCT Application No. PCT/JP2012/072359, with English Translation.
Japanese Office Action issued Sep. 8, 2015 in Patent Application No. 2011-195756 (with English Translation).
Masao Shimada, V-1. "Metal Superconductive Wires", Cryogenics, 1994, vol. 29 No. 9, pp. 453-461 (with Partial English Translation).
Noriyuki Shimizu et al., "Distributors of Current and Magnetic Field in AC Superconducting Cable and Detection of Quench", Articles of the Institute of Electrical Engineers of Japan, B, 1967, vol. 107, No. 9, pp. 457-463.

* cited by examiner

SUPERCONDUCTING COIL PROTECTION METHOD AND SUPERCONDUCTING MAGNET DEVICE

TECHNICAL FIELD

The present invention relates to a method for protecting a superconducting coil made by winding superconducting wire into a shape of a solenoid, a pancake, a saddle or the like, and relates to a superconducting magnet device.

BACKGROUND ART

As a method for protecting a superconducting coil (a method for preventing damage caused by a quench or the like), for example, there have been methods described in Patent Literatures 1 to 3. Patent Literature 1 describes a method in which a bridge circuit is connected to the both ends of a superconducting coil in parallel, and induced voltage noise etc. in an output of the bridge circuit is removed, thereby to improve accuracy in detecting a quench.

Patent Literature 2 describes a method in which, based on a detection signal from a quench detection circuit which detects a quench on the basis of an increase in voltage of a superconducting coil, electric current flowing through the superconducting coil is adjusted to prevent the quench of the superconducting coil.

Further, Patent Literature 3 describes a method in which a pickup coil is provided in the vicinity of a superconducting coil, and a quench is detected based on a voltage difference between a voltage generated in the superconducting coil and a voltage induced in the pickup coil.

CITATION LIST

Patent Literature

Patent Literature 1: Japanese Unexamined Patent Publication No. 274014/2001 (Tokukai 2001-274014)
Patent Literature 2: Japanese Unexamined Patent Publication No. 319139/2006 (Tokukai 2006-319139)
Patent Literature 3: International Publication WO2006/115126

SUMMARY OF INVENTION

Technical Problem

All the methods described in Patent Literatures 1 to 3 use the voltage generated in the superconducting coil (a change in voltage) for the detection of a quench.

Meanwhile, Re(Rare-earth element)-Ba—Cu—O ("ReBCO") superconducting wire typified by Re=Y-based wire has a very thin superconducting layer, and therefore, after a change from a superconducting state to a normal (non-superconducting) state, resistance in a normal-state zone is smaller. That is, a voltage generated therein is so small that the change to the normal state is not timely detected with the methods using the voltage (the change in voltage) as described in Patent Literatures 1 to 3. As a result, the temperature in the normal-state zone increases extraordinarily, which may deteriorate superconducting characteristics of the wire, or possibly, may result in burnout.

The present invention has been made under the foregoing circumstances, and an object of the present invention is to provide a method for protecting superconducting coil, which method prevents damage to the superconducting coil caused by a quench or the like in a new way without using a voltage (a change in voltage) generated in the superconducting coil.

Solution to Problem

As a result of wholehearted examinations for solving the above-mentioned problem carried out by the present inventors, it was found that a change in screening field immediately before a rapid increase in voltage between both ends of a superconducting coil (due to a quench) is slower than a change in the voltage between both ends of the superconducting coil. Based on the above findings, the present invention has been accomplished.

According to an aspect of the present invention, there is provided a method for protecting a superconducting coil made by winding superconducting wire, the method including the steps of: measuring a magnitude of a screening field induced by screening current flowing through the superconducting wire which is in a superconducting state; and decreasing electric current flowing through the superconducting wire based on the measured magnitude of the screening field.

Further, according to a second aspect of the present invention, there is provided a superconducting magnet device including: a superconducting coil made by winding superconducting wire; a housing for accommodating the superconducting coil in a superconducting state; and an power supply for energizing the superconducting coil, wherein the superconducting magnet device further includes a controller which measures a magnitude of a screening field induced by screening current flowing through the superconducting wire which is in the superconducting state, and decreases electric current flowing through the superconducting wire based on the measured magnitude of the screening field.

Advantageous Effects of Invention

With the present invention, damage to a superconducting coil caused by a quench or the like is prevented, without using a voltage (a change in voltage) generated in the superconducting coil, by decreasing electric current flowing through the coil based on the magnitude of a screening field induced by screening current flowing through superconducting wire.

DESCRIPTION OF EMBODIMENTS

The following describes embodiments of the present invention, with reference to the drawings. Note that, in Examples which will be described below, ReBCO wire (ReBCO superconducting wire) typified by Re=Y-based wire is used as superconducting wire; however, the present invention is applicable to other superconducting wire having a characteristic that large screening current is generated therein, even if it is different from the ReBCO wire in material or in manufacturing method.

(Structure of Y-based Wire)

Figure 1:
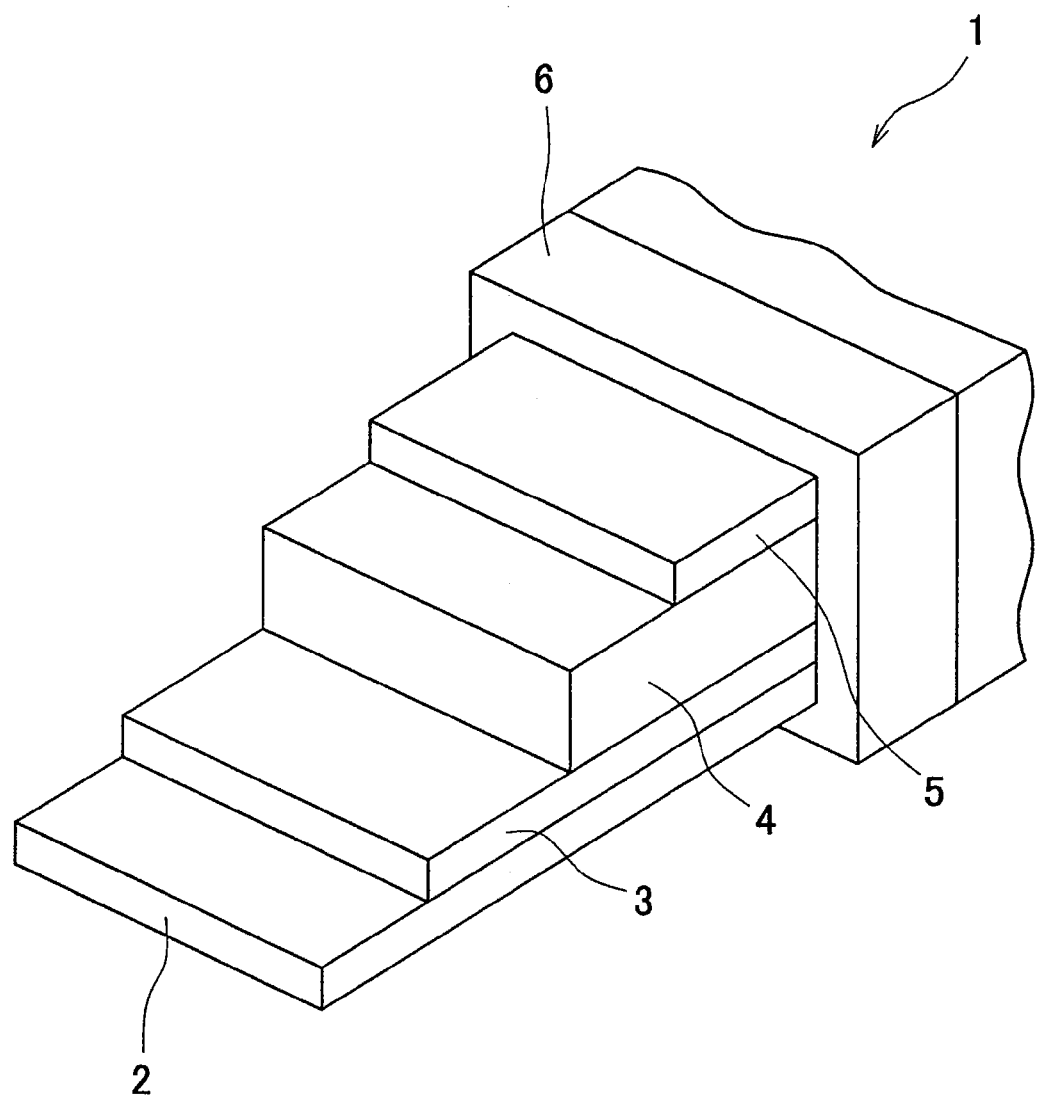
FIG. 1 is a perspective view showing the structure of Y-based superconducting wire.

FIG. 1 is a perspective view showing the structure of typical Y-based wire (Y-based superconducting wire). As shown in FIG. 1, the Y-based wire 1 is tape-like oxide-based superconducting wire having a structure such that: a buffer layer 3, a superconducting layer 4, and a stabilizing layer 5 are formed on a substrate 2 in this order; and these are covered, in whole, with electrical insulation 6. Although not shown, there is a case where two stabilizing layers are provided so as to sandwich the superconducting layer, or a case where the stabilizing layer encloses the other layers including the substrate. The substrate 2 is made of Hastelloy, Ni-Alloy, or the like, and the buffer layer 3 is made of YSZ, MgO, $CeO_2$, or the like. Further, the superconducting layer 4 is made of ReBCO, YBCO, NdBCO, SmBCO, or the like, and the stabilizing layer 5 is made of Ag, Ag—Cu, Cu, or the like. As the electrical insulation 6, for example, electrical insulating tape (polyimide or polyester) is used. The thickness of the substrate 2 is less than or equal to 200 µm, and the thicknesses of the buffer layer 3, the superconducting layer 4, and the stabilizing layer 5 are less than 3 µm, 1 to 10 µm, and 50 to 100 µm, respectively. The width of the Y-based wire 1 is on the order of 2 mm to 15 mm.

(Characteristics of Quench in ReBCO Wire (Re=Y-Based Wire))

Figure 2:
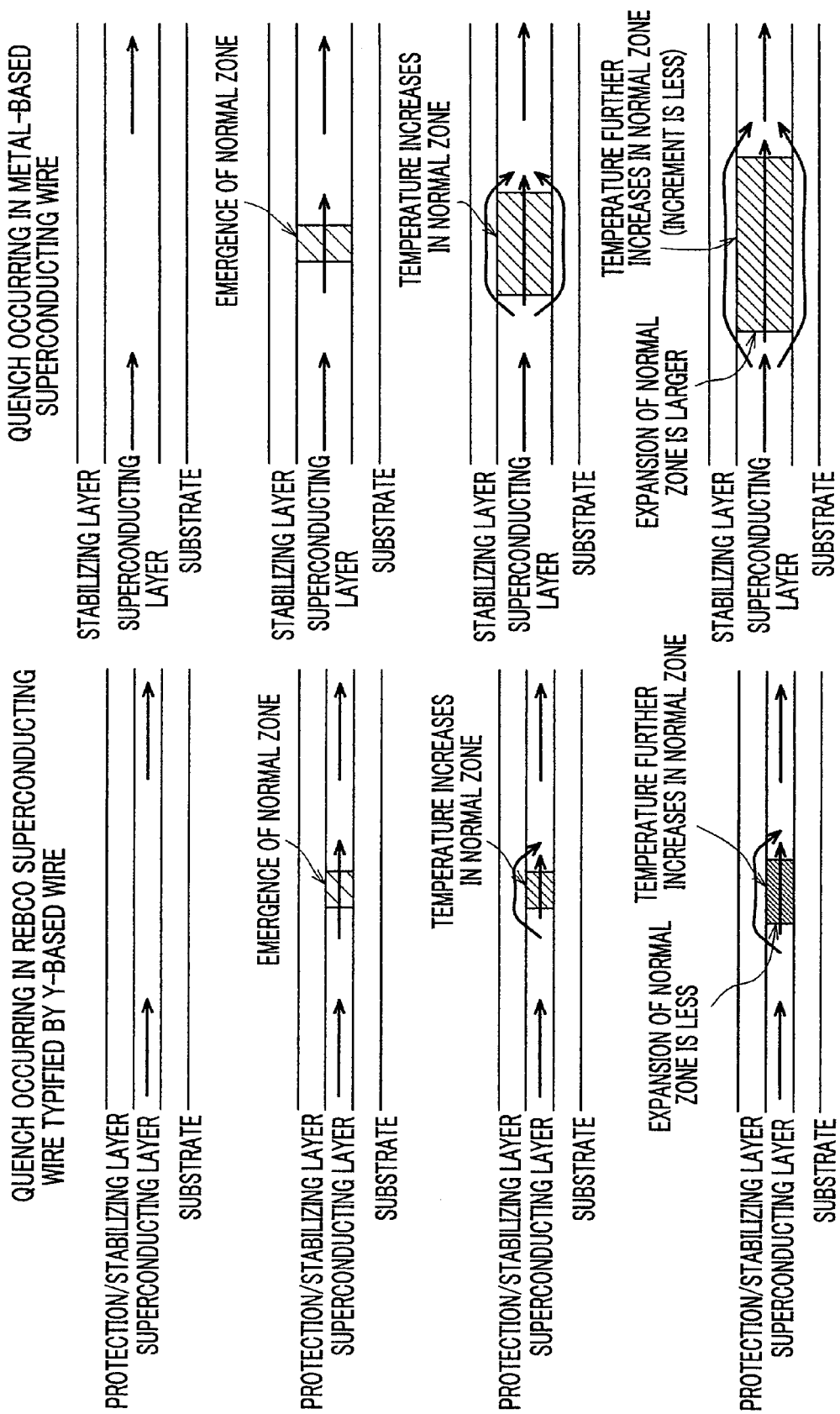
FIG. 2 is a diagram showing a quench occurring in ReBCO superconducting wire and a quench occurring in metal-based superconducting wire.
Figure 3:
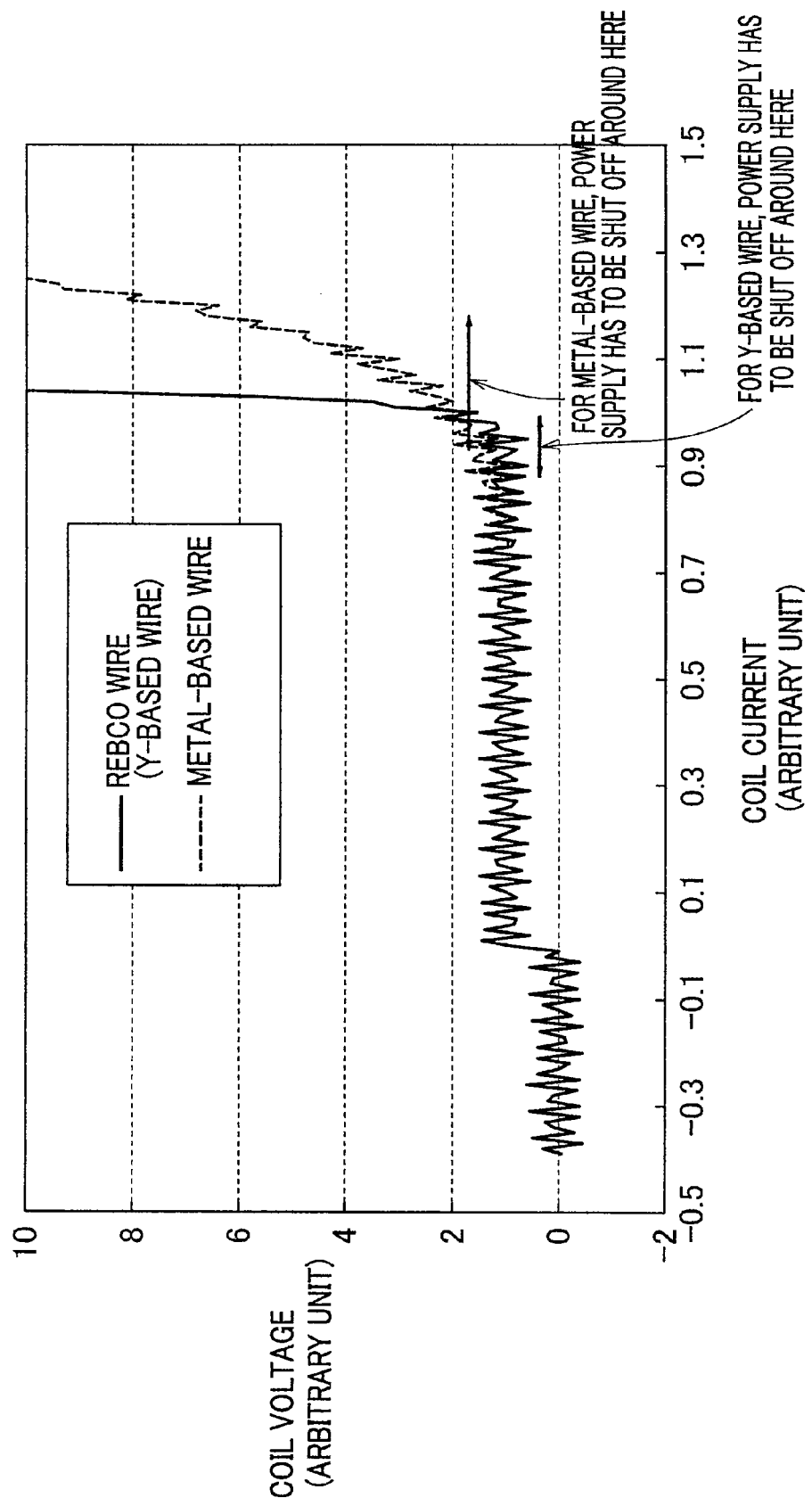
FIG. 3 is a graph showing a quench occurring in the ReBCO superconducting wire and a quench occurring in the metal-based superconducting wire.

FIGS. 2 and 3 are a diagram and a graph respectively, each showing a quench occurring in ReBCO superconducting wire and a quench occurring in metal-based superconducting wire.

When, in a superconducting coil made by winding superconducting wire, which is energized in the superconducting state, a part of the wire loses the superconducting state into the normal state, that is, it quenches, the normal-state zone is subjected to Joule heating caused by electric current flowing through the wire and electrical resistance generated thereby, which raises its temperature. This further increases the resistance, resulting in a further increase in temperature. The temperature increases sharply, and the normal-state zone may possibly be melted.

Therefore, it is necessary to detect the change to the normal state (occurrence of a quench) promptly and decrease the electric current passing therethrough. In general, for example, the following method has been adopted: the voltage across the superconducting coil or at apart thereof is measured, and a rapid change in voltage induced by increase or decrease in the magnitude of the magnetic field is detected, based on which its power supply is shut off.

However, the ReBCO wire has a very thin superconducting layer, and therefore, after a change from the superconducting state to the normal state, resistance in the normal-state zone is smaller. That is, the voltage generated therein is so small that the change to the normal state is not timely detected with the above-described method using the change in voltage. As a result, the temperature in the normal-state zone increases extraordinarily, which may deteriorate superconducting characteristics of the ReBCO wire, or possibly, may result in burnout.

As a result of wholehearted examinations for solving the above-mentioned problem carried out by the present inventors, it was found that a change in screening field (screening current-induced magnetic field) immediately before a rapid increase in voltage between both ends of the superconducting coil is slower than the change in voltage between both ends of the superconducting coil.

Example 1

Figure 4:
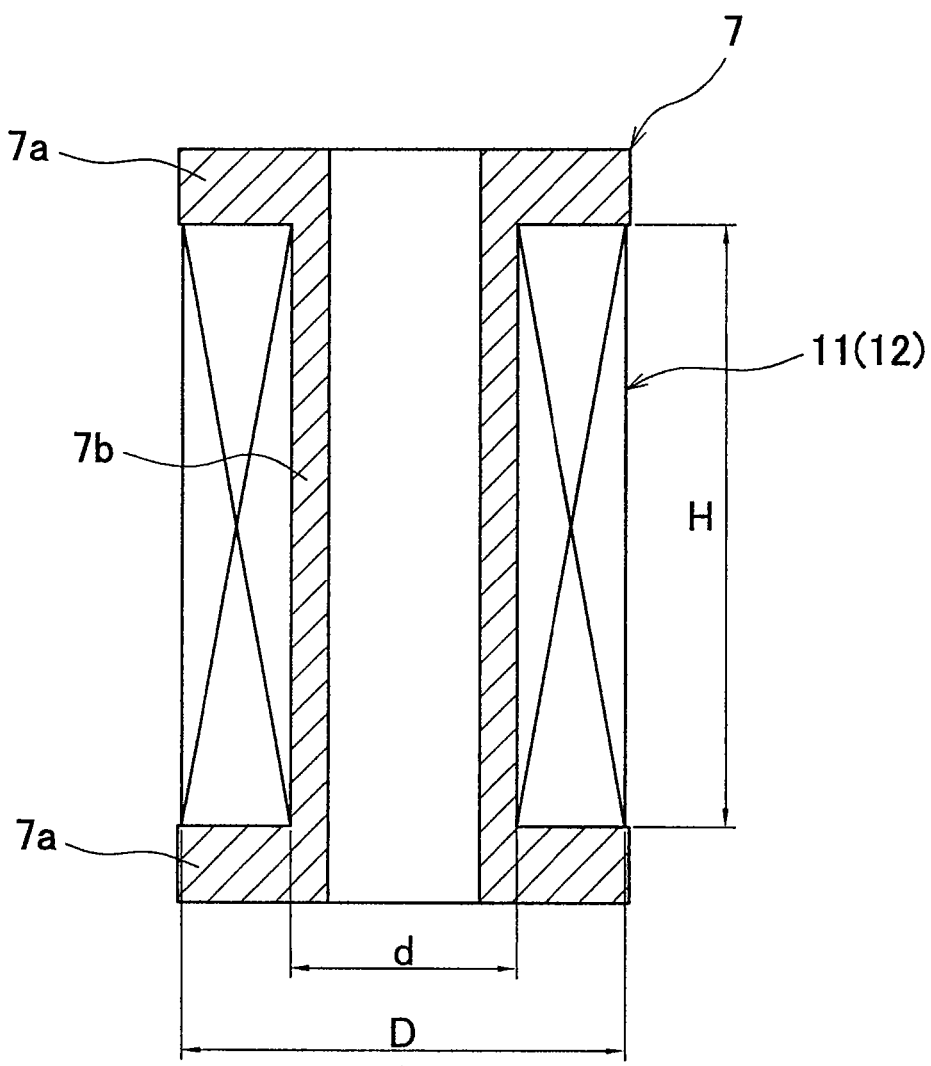
FIG. 4 is a sectional view for describing dimensions of a superconducting coil used in a test.

Two types of solenoid superconducting coils 11 and 12 (layer-wound coil) shown in FIG. 4 and Table 1 were fabricated using the ReBCO wire, to evaluate the effectiveness in detection of a quench. In Example 1, the superconducting coil 11 was used.

TABLE 1

| COIL (REFERENCE SIGN) | NUMBER OF TURNS × NUMBER OF LAYERS | WINDING INNER DIAMETER d(mm) | WINDING OUTER DIAMETER D(mm) | WINDING HEIGHT H(mm) | WIRE LENGTH (m) | COIL CONSTANT (mT/A) |
|---|---|---|---|---|---|---|
| 11 | 29 × 38 | 53 | 78 | 126 | 230 | 9.8 |
| 12 | 29 × 14 | 20 | 24 | 81 | 15 | 4.9 |

The ReBCO wire used in a test was SCS4050 (Kapton (Registered Trademark), insulated) made by SuperPower Inc. The tape-like superconducting wire was wound around a barrel portion 7b of a coil former 7, which has flange portions 7a and the barrel portion 7b, to obtain the superconducting coil 11, and the coil was impregnated with wax. A direction perpendicular to a tape surface of the ReBCO wire forming the superconducting coil 11 matches a radial direction of the superconducting coil 11. Note that, in its windings, there were four joints between the superconducting wires, and the length of each joint is 100 mm.

The superconducting coil 11 was energized in liquid helium in the absence of a magnetic field. Electric current flowing through the superconducting coil 11 was changed according to the following pattern: 0 A-40 A-200 A-300 A-310 A-320 A-330 A-340 A-350 A-360 A-367 A. As a result, the superconducting coil 11 burned out when the electric current was 367 A. A power supply for energizing the coil had been set so that the output electric current is promptly decreased to 0 A when the voltage between both ends of the superconducting coil 11 exceeds 0.1 V (100 mV). Note that, a superconducting coil made of metal-based superconducting wire does not burn out and no deterioration is found in its superconducting characteristics, even if the coil is energized according to the above-described pattern.

The current density in the windings of the superconducting coil 11 at the operating current of 367 A was 257 A/mm$^2$.

Figure 5:
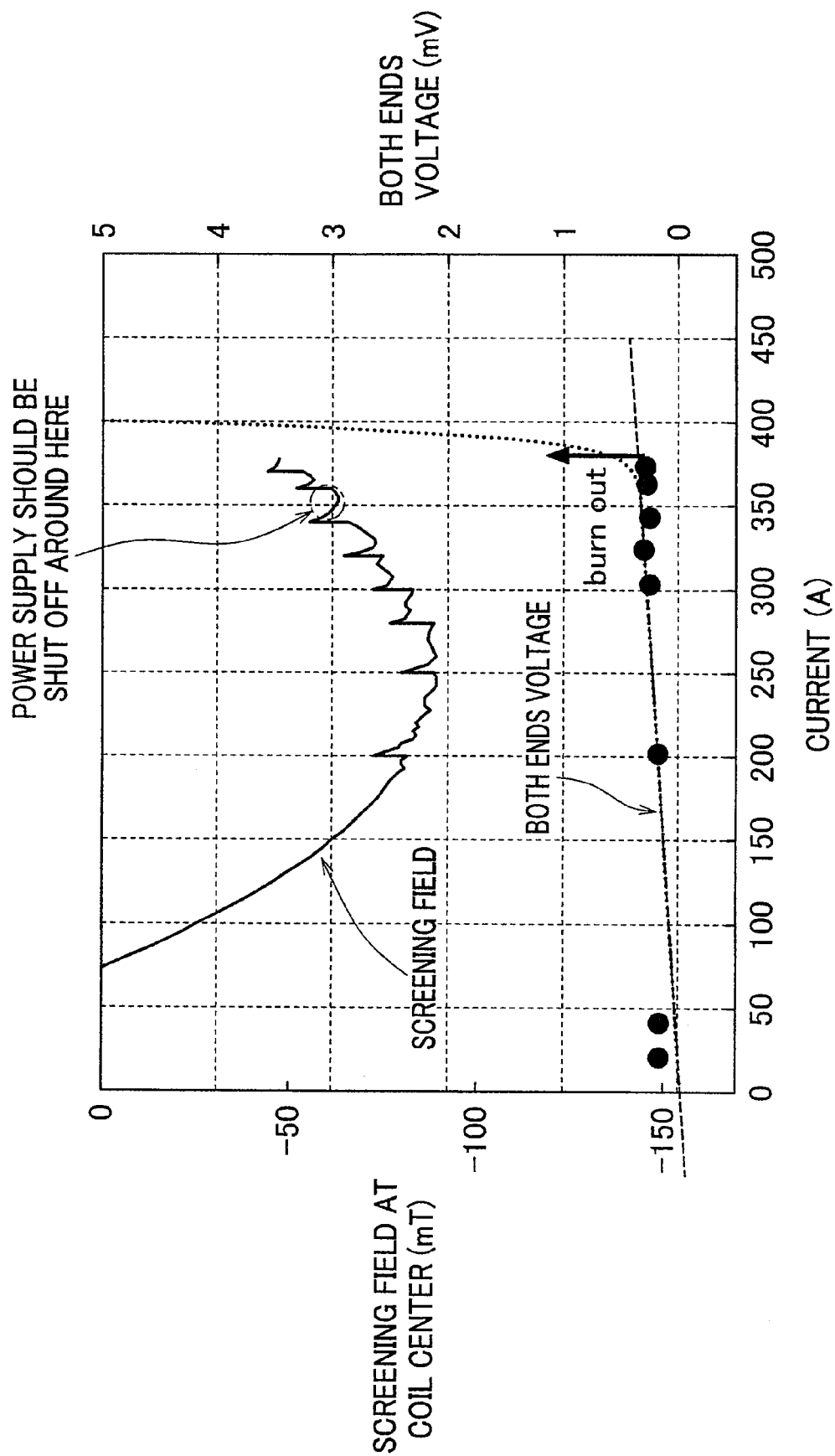
FIG. 5 is a graph showing a result obtained when the superconducting coil was energized in liquid helium.

FIG. 5 shows a result obtained when the superconducting coil 11 was energized. Note that, the screening field on an ordinate is the screening field at the center of the superconducting coil 11 ("coil center"). The screening field at the coil center is obtained by subtracting a magnetic field Bcal, which is a magnetic field in an axial direction of the coil calculated disregarding the effect of screening current, from a magnetic field in the axial direction measured at the coil center ("measured magnetic field B").

As shown in FIG. 5, since the effect of the screening current is greater at the beginning of the energization, the value of the screening field greatly shifts in a negative direction. The voltage between both ends of the superconducting coil 11 gradually increased to about 0.5 mV, and then the voltage suddenly spiked and the superconducting coil 11 burned out. The voltage increase immediately before the voltage spike is on the same order of the voltage increase during the energization, and this shows that it is difficult to timely shut off the power supply based on the change in voltage between both ends of the coil.

On the other hand, the change in screening field is slower than the change in voltage between both ends of the coil, which shows that the burnout of the superconducting coil 11 is prevented by shutting off the power supply when the value of the screening field reaches a predetermined threshold on the way to approaching 0 (zero). That is, the magnitude of the screening field is measured, and based on the thus obtained magnitude of the screening field, electric current flowing through the superconducting coil 11 (superconducting wire) is decreased (for example, the electric current is shut off (is promptly decreased to 0 (zero))), and thereby, damage to the superconducting coil 11 caused by a quench or the like is prevented. In FIG. 5, a recommended point for shutting off the power supply is shown as an example.

Example 2

In Example 2, the above-described superconducting coil 12 was used. The ReBCO wire used in a test was SCS4050 (Kapton, non-insulated) made by Superpower Inc. The superconducting coil 12 was made through the following process: the wire of SCS4050 (Kapton, non-insulated) made by SuperPower Inc was coated with enamel (thickness: approximately 0.18 mm) to increase the current density in its windings; the coated wire was wound into a coil; and the thus obtained coil was impregnated with wax. The current density in the windings of the superconducting coil 12 is 1193 A/mm$^2$ for 0 T, and 795 A/mm$^2$ for 12 T, which are extremely high.

Figure 6:
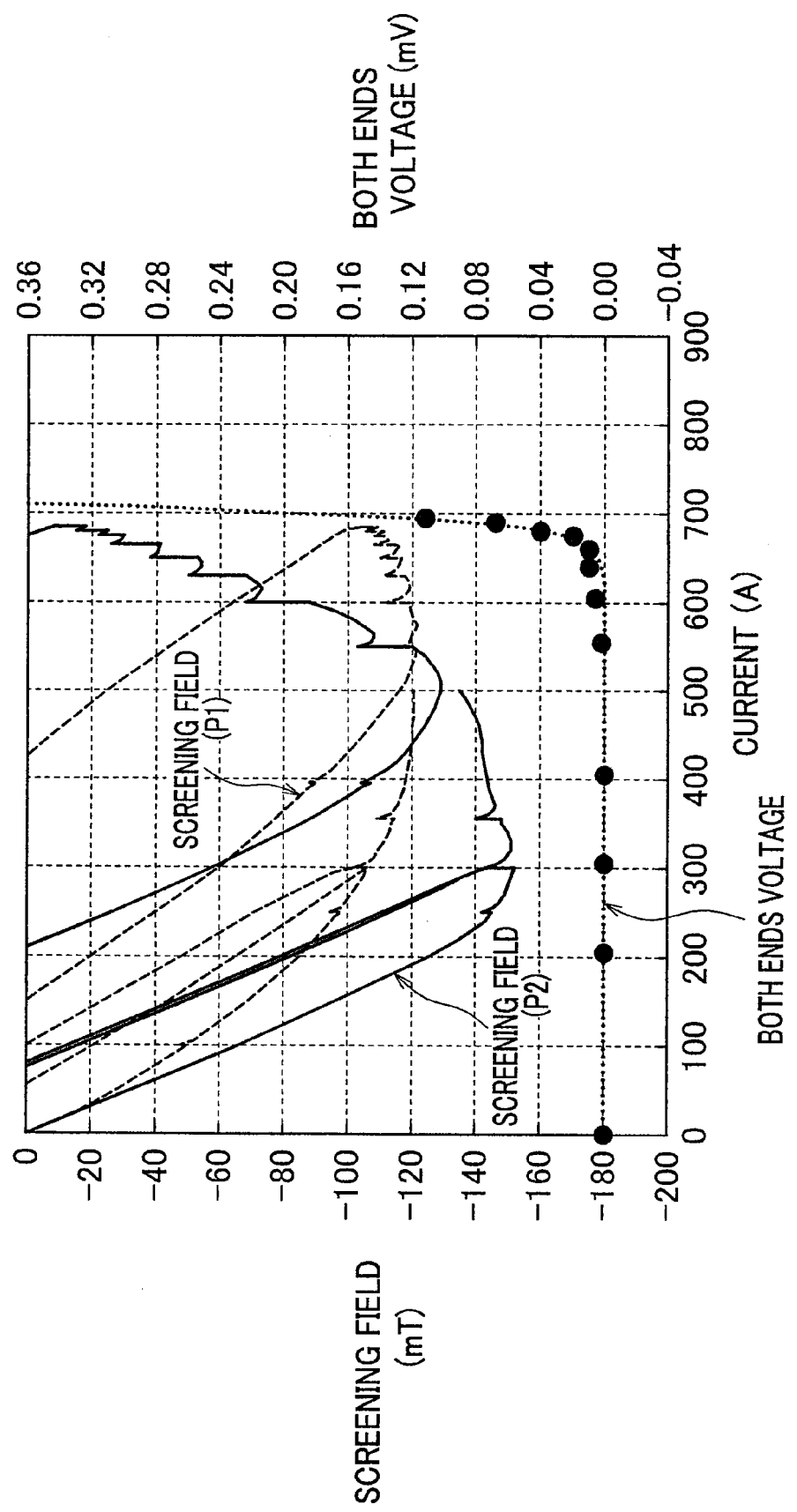
FIG. 6 is a graph showing a result obtained when the superconducting coil was energized in liquid helium.
Figure 7:
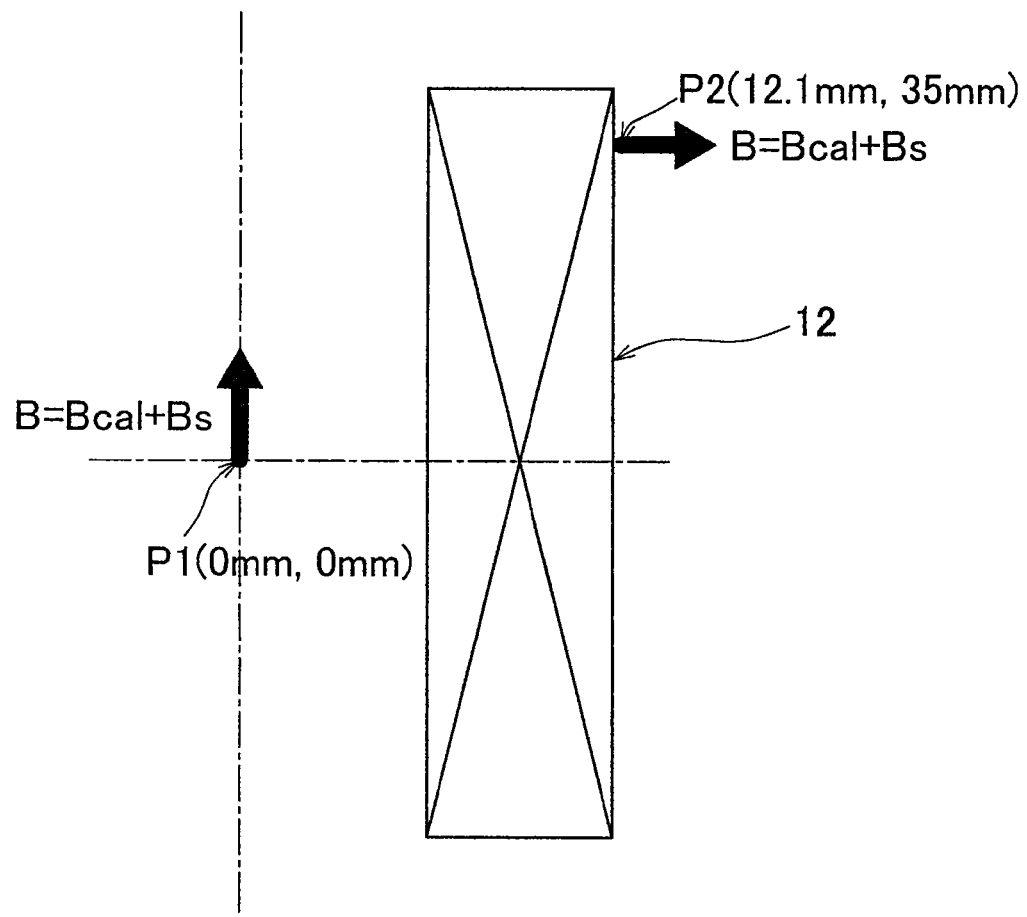
FIG. 7 is a diagram showing positions where a magnetic field was measured.

In the same way as in Example 1, the superconducting coil 12 was energized in liquid helium in the absence of a magnetic field. FIG. 6 shows its result. FIG. 7 shows positions where the magnetic field was measured. As shown, in this test, the magnetic field was measured not only at the coil center P1, but also at a position near an outer periphery of an axial end of the coil ("coil peripheral position P2"). Note that, a measured magnetic field B is the sum of a screening field Bs induced by screening current and a magnetic field Bcal calculated disregarding the effect of the screening current.

In FIG. 6, the screening field Bs at the coil center P1 (indicated with dotted lines), which is on the ordinate, was obtained by subtracting the magnetic field Bcal in the axial direction of the coil at the coil center P1, which magnetic field was calculated disregarding the effect of the screening current, from the measured magnetic field B in the axial direction of the coil at the coil center P1. Meanwhile, the screening field Bs at the coil peripheral position P2 (indicated with solid lines) was obtained by subtracting the magnetic field Bcal in a radial direction of the coil (the direction of the thickness of the ReBCO wire (superconducting wire) forming the superconducting coil 12) at the coil peripheral position P2, which magnetic field was calculated disregarding the effect of the screening current, from the measured magnetic field B in the radial direction of the coil at the coil peripheral position P2.

As shown in FIG. 6, the screening field Bs at the coil peripheral position P2 became substantially 0 (zero) immediately before the quench. The voltage between both ends of the superconducting coil 12 sharply rises immediately before the quench, whereas the screening field Bs at the coil peripheral position P2 gradually approaches 0 (zero). This shows that the screening field Bs is useful to shut off the power supply before the occurrence of the quench. Further, FIG. 6 shows that, measurement of the magnetic field in the radial direction of the coil (the direction of the thickness of the superconducting wire) is remarkably effective to predict the occurrence of the quench in the superconducting coil.

Note that, the outer peripheral surface of the coil is an area which is not used usually, and therefore, there is no problem in practice even if a magnetic sensor (a sensor for measuring a magnetic field, such as a Hall element, a pickup coil) is provided here.

(Regarding the Position where the Magnetic Field is Measured (Position for which the Screening Field is Obtained))

Figure 8:
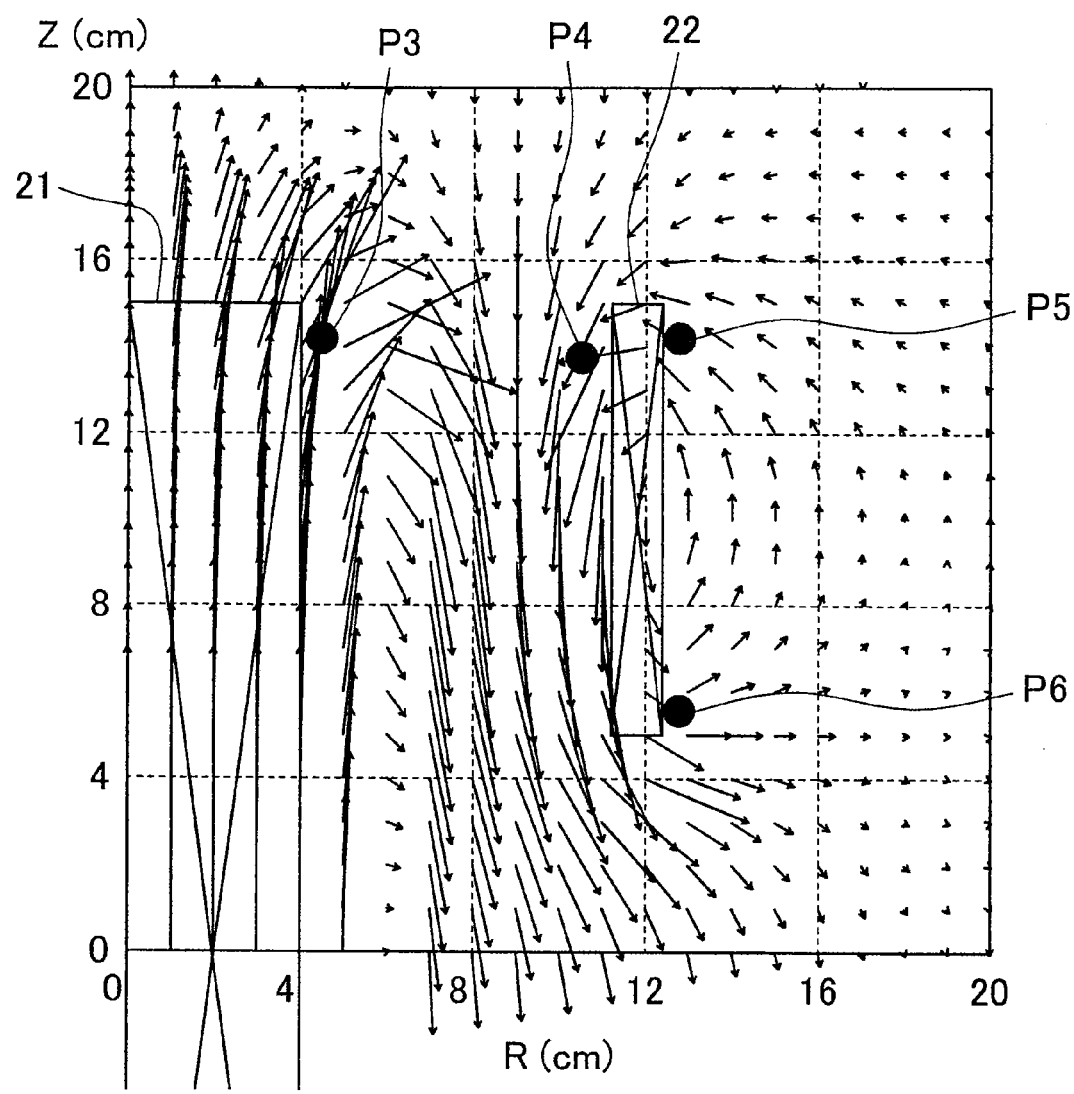
FIG. 8 is a diagram showing magnetic field distribution in a case where a plurality of superconducting coils are arranged.

FIG. 8 is a diagram showing magnetic field distribution in a case where a plurality of superconducting coils 21 and 22 are arranged. Each of a large number of arrows in the figure indicates the magnitude and direction of the magnetic field at the corresponding position. Here, the radial direction of each superconducting coil made by winding the tape-like superconducting wire matches the direction of the thickness of the superconducting wire (specifically, the direction perpendicular to the tape surface).

In order to prevent damage to the superconducting coil caused by a quench or the like based on the magnitude of the screening field, it is preferable to measure the magnetic field component in the direction of the thickness of the superconducting wire forming the superconducting coil (specifically, the direction perpendicular to the tape surface) at a position where the magnetic field component in the direction of the thickness of the superconducting wire forming the superconducting coil is larger. In the example shown in FIG. 8, the magnetic field component in the direction of the thickness of the superconducting wire is largest at a position P3, followed by positions P4, P5, and P6 in this order. Thus, in the superconducting coil, the magnetic field component in the direction of the thickness of the superconducting wire forming the superconducting coil (specifically, the direction perpendicular to the tape surface) is larger at a position near the outer periphery of an axial end of the coil (an end in the axial direction of the coil). Therefore, accuracy in preventing a quench from occurring (or in detecting a quench) is improved by: measuring the magnetic field at the position near the outer periphery of the axial end of the superconducting coil; obtaining the magnitude of the screening field in the direction of the thickness of the superconducting wire at this position; and decreasing electric current flowing through the coil (for example, shutting off the electric current) when the magnitude of the screening field reaches a predetermined threshold.

(Superconducting Magnet Device)

Figure 9:
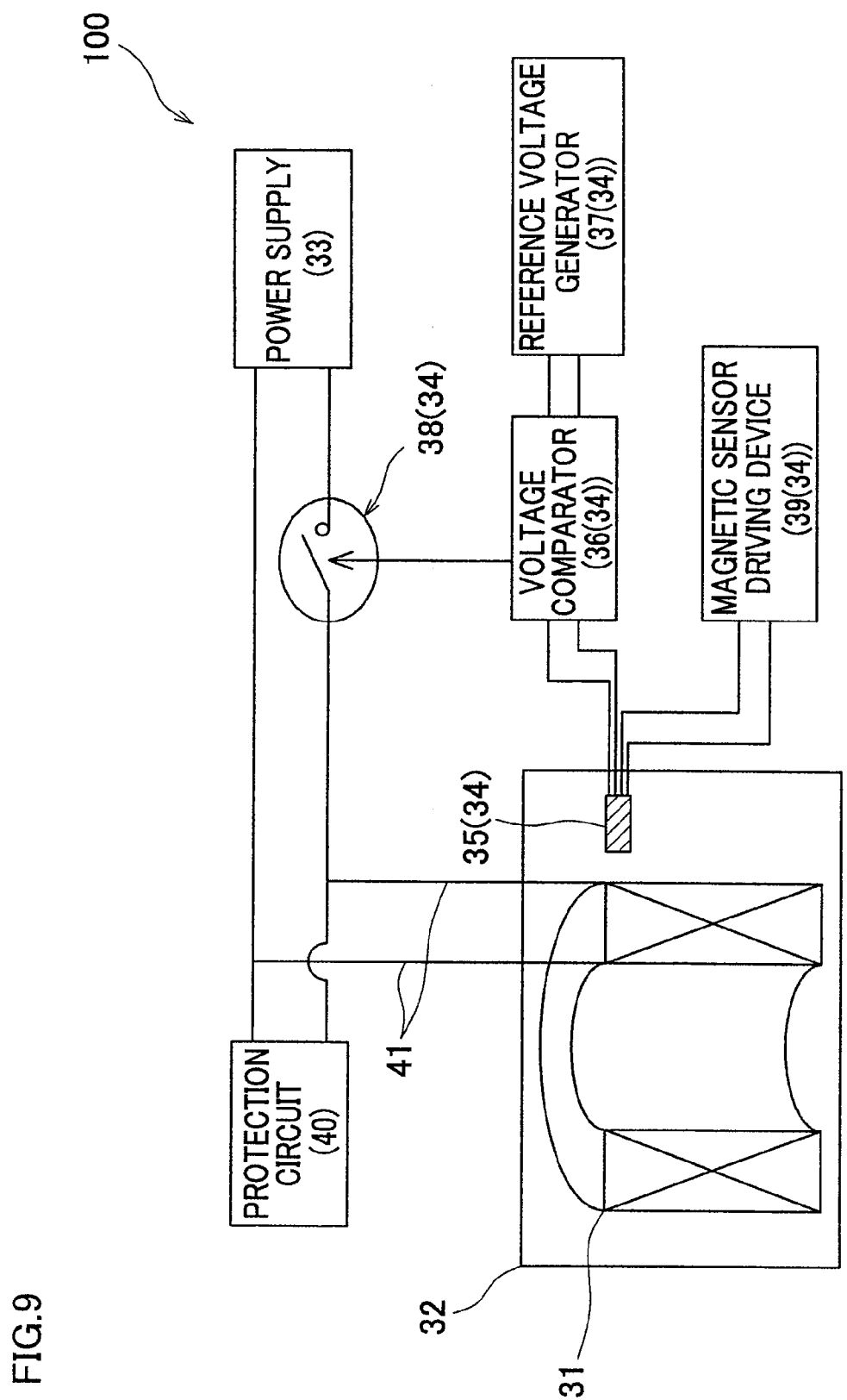
FIG. 9 is a block diagram showing a superconducting magnet device of an embodiment of the present invention.

FIG. 9 is a block diagram showing a superconducting magnet device 100 of an embodiment of the present invention. As shown in FIG. 9, for example, the superconducting magnet device 100 includes: a superconducting coil 31 made by winding tape-like superconducting wire having a superconducting layer; a housing 32 for accommodating the superconducting coil 31 in the superconducting state; a power supply 33 for energizing the superconducting coil 31; and a protection circuit 40 for protecting the superconducting coil 31 from a quench. The superconducting wire forming the superconducting coil 31 is, for example, ReBCO wire typified by Y-based wire. The housing 32 is a vacuum vessel or a cryogenic vessel. Further, the protection circuit 40 includes a protection resistor and the like. Electric current fed from the power supply 33 flows to the superconducting coil 31 via a current lead 41.

Here, the superconducting magnet device 100 further includes a controller 34 which shuts off the power from the power supply 33, based on the magnitude of a screening field induced by screening current flowing through the superconducting coil 31 (superconducting wire) which is in the superconducting state.

The controller 34 includes: a magnetic sensor 35 which measures a magnetic field B in the direction of the thickness of the superconducting wire at a predetermined position; and a power shut-off device which shuts off the power fed from the power supply 33 to the superconducting coil 31 based on a signal from the magnetic sensor 35. The power shut-off device includes: a reference voltage generator 37; a voltage comparator 36; and a power shut-off unit 38, and the power shut-off device shuts off the power fed from the power supply 33 to the superconducting coil 31 based on the magnitude of a screening field Bs, which is a difference between the magnetic field B measured by the magnetic sensor 35 and a magnetic field Bcal in the direction of the thickness of the superconducting wire calculated disregarding the effect of the screening current. The magnetic sensor 35 is driven by a magnetic sensor driving device 39.

In this embodiment, the magnetic sensor 35 is located in the vicinity of an outer peripheral surface of an upper axial end of the superconducting coil 31. Note that, the position where the magnetic sensor 35 is provided is not limited to this. Further, the structure of the controller 34 is not limited to that in this embodiment.

Here, the reference voltage generator 37 outputs, to the voltage comparator 36, a value of the screening field Bs (a value of that in the vicinity of the outer peripheral surface of the upper axial end of the superconducting coil 31) of a predetermined level at which the power from the power supply 33 should be shut off (a predetermined threshold value of the screening field Bs), as a reference voltage signal. The reference voltage signal from the voltage comparator 36 and a signal (signal of the measured magnetic field) from the magnetic sensor 35 are input to the voltage comparator 36. Note that, the reference voltage signal (reference voltage) has been determined in advance based on a quench test or the like of the superconducting coil 31; however, it is changeable based on the status of operation.

In the voltage comparator 36, based on the signal from the magnetic sensor 35 (signal of the measured magnetic field), calculated is the magnitude of the screening field Bs, which is a difference between the magnetic field B measured by the magnetic sensor 35 and the magnetic field Bcal in the direction of the thickness of the superconducting wire calculated disregarding the effect of the screening current. Then, the voltage comparator 36 compares the thus obtained screening field Bs (voltage signal) with the reference voltage signal from the voltage comparator 36. When the screening field Bs (voltage signal) increases once and then decreases, and thereafter it reaches (decreases to) the reference voltage (the predetermined threshold value), the voltage comparator 36 outputs, to the power shut-off unit 38, an electric signal for shutting off the power from the power supply 33. An electrical contact is opened by the power shut-off unit 38, and thereby the power from the power supply 33 is shut off.

In this embodiment, the power from the power supply 33 is shut off by the power shut-off unit 38 based on the magnitude (an absolute value) of the screening field Bs; however, the present invention is not limited to such a manner that the power from the power supply 33 is shut off by the power shut-off unit 38. For example, when the magnitude (absolute value) of the screening field Bs once increases and then decreases, and thereafter, it reaches the predetermined threshold value, the power supply may cause the amount of the electric current to be 0 (zero) or may decrease the electric current, by its own function. What is essential is to decrease the electric current flowing through the superconducting wire based on the magnitude of the screening field Bs, and there are many variations on the manners for decreasing the electric current flowing therethrough. Shutting off the power from the power supply 33 is one example of decreasing the electric current flowing through the superconducting wire.

Further, in this embodiment, the magnetic field in the radial direction of the coil is measured in the vicinity of the outer peripheral surface of the upper axial end of the superconducting coil 31; however, the present invention is not limited to this. Prevention of a quench (or detection of a quench) is achieved by: measuring a magnetic field (magnetic field component) whose direction is within ±40 degrees, preferably within ±36.9 degrees of the direction perpendicular to the tape surface of the tape-like superconducting wire at a position in the vicinity of the periphery of the coil, the position having a large magnetic field (magnetic field component) in the direction perpendicular to the tape surface; and determining an upper limit of the electric current flowing therethrough based on the magnitude of the screening field. When the direction is within ±36.9 degrees, sensitivity degradation in the value of the measured magnetic field is limited to not more than 20%.

Note that, the "direction of the thickness" of the superconducting wire, used in the description of the embodiment, represents not only a direction strictly perpendicular to the tape surface of the superconducting wire, but encompasses a direction slightly inclined relative to the direction strictly perpendicular to the tape surface of the superconducting wire.

Further, the following manner is also possible: by a quench test for the superconducting coil, the upper limit value of the electric current to be passed therethrough is determined in advance based on a change in or the magnitude of the screening field Bs immediately before a quench; the upper limit value is input beforehand to the reference voltage generator 37 as a reference voltage signal (reference voltage); the reference voltage signal (reference voltage) and the electric current flowing through the superconducting coil are compared with each other in the voltage comparator 36; and when the voltage signal representing the electric current flowing through the superconducting coil reaches the reference voltage, the electrical contact is opened by the power shut-off unit 38, to shut off the power from the power supply 33 (to decrease the amount of the electric current flowing therethrough).

Hereinbefore, the embodiments of the present invention have been described. It should be noted that the present invention is not limited to the thus described embodiments, and various modifications are possible within the scope of appended claims.

In the embodiments, the solenoid superconducting coil is described as an example; however, the present invention is also applicable to a superconducting coil made by winding superconducting wire into a shape of a pancake, a saddle, or the like.

REFERENCE SIGNS LIST

1: Y-based superconducting wire
2: substrate
3: buffer layer
4: superconducting layer
5: stabilizing layer
6: electrical insulation
11, 12, 21, 22, 31: superconducting coil
100: superconducting magnet device

The invention claimed is:

1. A method for protecting a superconducting coil made by winding superconducting wire, the method comprising:
measuring a magnetic field in a direction of a thickness of the superconducting wire at a predetermined position; and
decreasing electric current flowing through the superconducting wire based on a magnitude of a screening field, which is a difference between the measured magnetic field and another magnetic field in the direction of the thickness calculated disregarding an effect of a screening current flowing through the superconducting wire which is in a superconducting state.

2. The method for protecting the superconducting coil according to claim 1, wherein
the electric current flowing through the superconducting wire is decreased based on the magnitude of the screening field at a position near an outer periphery of an axial end of the superconducting coil.

3. The method for protecting the superconducting coil according to claim 1, wherein
power from a power supply to the superconducting coil is shut off when the magnitude of the screening field once increases and then decreases to a predetermined threshold value.

4. A superconducting magnet device comprising:
a superconducting coil made by winding superconducting wire;
a housing for accommodating the superconducting coil in a superconducting state; and
a power supply for energizing the superconducting coil, wherein
the superconducting magnet device further comprises a controller configured to measure a magnitude of a screening field induced by screening current flowing through the superconducting wire which is in the superconducting state, and to decrease electric current flowing through the superconducting wire based on the measured magnitude of the screening field,
the controller includes a magnetic sensor which measures a magnetic field in a direction of a thickness of the superconducting wire at a predetermined position, and
the controller decreases the electric current flowing through the superconducting wire based on the magnitude of the screening field, which is a difference between the magnetic field measured by the magnetic sensor and another magnetic field in the direction of the thickness calculated disregarding an effect of the screening current.

5. The superconducting magnet device according to claim 4, wherein the magnetic sensor is located at a position near an outer periphery of an axial end of the superconducting coil.

6. The superconducting magnet device according to claim 4, wherein
the controller includes a power shut-off device which shuts off power from the power supply to the superconducting coil when the magnitude of the screening field once increases and then decreases to a predetermined threshold value.

* * * * *